United States Patent [19]

Nakanishi et al.

[11] Patent Number: 4,870,477
[45] Date of Patent: Sep. 26, 1989

[54] INTEGRATED CIRCUIT CHIPS COOLING MODULE HAVING COOLANT LEAKAGE PREVENTION DEVICE

[75] Inventors: Keiichirou Nakanishi, Kokubunji; Minoru Yamada, Iruma, both of Japan

[73] Assignee: Hitachi, Ltd., Tokyo, Japan

[21] Appl. No.: 52,396

[22] Filed: May 21, 1987

[30] Foreign Application Priority Data

May 23, 1986 [JP] Japan ................. 61-117415

[51] Int. Cl.⁴ ............... H01L 23/46; H01L 23/36
[52] U.S. Cl. ............................. 357/82; 361/385
[58] Field of Search ................... 357/82; 361/385; 165/80.4

[56] References Cited

U.S. PATENT DOCUMENTS 4,558,395 12/1985 Yamada et al. ............ 361/385
4,644,385 2/1987 Nakanishi et al. .......... 352/82
4,686,606 8/1987 Yamada et al. ............ 361/385

FOREIGN PATENT DOCUMENTS 55-156349 12/1980 Japan ................... 357/82
58-106852 6/1983 Japan ................... 357/82

Primary Examiner—Rolf Hille
Assistant Examiner—S. V. Clark
Attorney, Agent, or Firm—Antonelli, Terry & Wands

[57] ABSTRACT

An improved integrated circuit chips cooling module in which a cooling member having an inside space through which a coolant flows is attached to each of the integrated circuit chips by pressure welding or anchoring to effect cooling, wherein the improvement comprises providing coated portions for each portion of the surface of the coolant flow system where the coolant leakage may possibly take place, the coating of said coated portions comprising an organic or inorganic high-molecular weight compound curable by reacting with the coolant to keep the latter from leakage.

20 Claims, 3 Drawing Sheets

LEAK DETECTION INDICATOR

INTEGRATED CIRCUIT CHIPS COOLING MODULE HAVING COOLANT LEAKAGE PREVENTION DEVICE

BACKGROUND OF THE INVENTION

This invention relates to an integrated circuit chips cooling module having a coolant leakage prevention device. More particularly, it relates to an integrated circuit chips cooling module provided with a coolant leakage prevention device and a coolant leakage detection means in the field of water-cooled multichip modules which are required to be of high reliability for use in a high speed computer among others.

In the field of a computer or the like, there is widely adopted a packaging system in which in order to achieve a high speed circuit operation, integrated circuit chips of high power consumption are densely arranged on a wiring substrate such as printed circuit board or ceramic board. The power dissipation of such a wiring substrate amounts to several hundreds watts. It is apparent, therefore, that it is an important key to the embodiment of a high speed computer to work out a powerful and compact cooling system for absorbing a large dissipated power.

To meet the above requirements, various cooling devices have heretofore been proposed. Examples are U.S. Pat. Nos. 4,558,395 and 4,644,385. The coolant flow systems for these integrated circuit cooling modules of the prior art are provided with, for example, pipes in bellows form. The conceivable methods for the manufacture of such bellow include electrocasting using an electroplating technique, lamination of a large number of metals using welding or similar joining techniques, and plastic working of metal pipes by press forming or the like. In all of these joining techniques, it is necessary for the production of flexible bellows to make the final wall thickness sufficiently small. In such a case, it is anticipated that there is a possibility of coolant leakage into the cooling module caused by pin holes formed during the fabrication of bellows or by corrosion due to the flow of coolant after assembly of the cooling module. In the above patent literature, nothing has been disclosed about the coolant leakage prevention means.

SUMMARY OF THE INVENTION

An object of this invention is to provide an integrated circuit chips cooling module provided with a coolant leakage prevention device or a coolant leakage detection means in the coolant flow system, which when coolant leakage takes place, detects the location of leakage and transmits an alarm or the like as well as repairs automatically the spot of leakage, thereby to permit uninterrupted operation of the integrated circuit chips cooling module until the time of scheduled maintenance inspection.

In one aspect of the present invention, a coated portion comprising an organic or inorganic compound of high molecular weight and curable upon reacting with the leaked coolant to keep the latter from leaking is formed at least on a part of the coolant flow system of the integrated circuit chips cooling module, particularly on the surface of the portion where the coolant leakage may possibly take place such as the bellows-like pipes, thereby to automaticaly prevent leakage of the coolant and to actuate a display for the location of leakage or to transmit an alarm by detecting the by-product formed in said curing reaction. The formation of the coated portion can be achieved by a customary method such as coating, dipping, or the like.

In another aspect of the present invention, in providing the coated portion, the wall of the portion where the possibility of leakage exists is made double and the gap of double-wall filled with the high-molecular compound.

As the coolants used in the coolant flow system of the present integrated circuit chips cooling module, there may be mentioned water, Freon, Fluorinert (3M Co. U.S.A.), etc. The high-molecular weight compounds useful for the coolant leakage prevention according to this invention are organic as well as inorganic types curable upon reaction with the coolant, thereby yielding a plastic product which is relatively resilient and exhibits good adherenece to the surface of coolant flow system.

The inorganic high-molecular weight compound, as herein referred to, is that having in the molecule a recurring unit $-M-L_n$ (where n is a relatively large number) formed by an atom M and another atom L. Such a high-molecular compound having the aforesaid function can be used. As organic high-molecular compounds, mention may be made of various polymers including those obtained from organic silane compounds having the aforesaid function.

With respect to the above description, the relationship to the coolant is as described below.

A generally employed coolant is water. In this case, a preferred high-molecular compound is a polymer formed by the reaction under anhydrous conditions between a reactive polysiloxane represented by the general formula

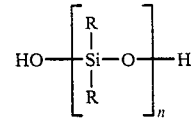

(wherein R represents an alkyl group such as methyl or ethyl group, a phenyl group, or a fluoroalkyl group) and a polyfunctional silane compound (crosslinking agent) having a hydrolyzable group such as alkoxy, acetoxy, or ketoxime group. Upon contact with water, such a polymer becomes cured by condensation reaction of the alcohol, oxime, acetic acid, amide, or amine elimination type, thereby yielding an organic silicone rubber excellent in resilience and adherence, which automatically seals the leaking spot. At the same time as the formation of organic silicon rubber, there is formed a by-product such as alcohol, oxime, acetic acid, or the like. There is provided a leakage detection means which detects the by-product such as an alcohol by a sensor and actuates a display for the location of water leakage or transmits an alarm.

These and other objects and many of the attendant advantages of this invention will be readily appreciated as the same becomes better understood by reference to the following detailed description when considered in connection with the accompanying drawings.

DETAILED DESCRIPTION OF PREFERRED EMBODIMENTS

In the integrated circuit chips cooling module of this invention, when the leakage of coolant occurs in the defective coolant flow system through a pin hole for example, the high-molecular weight compound disposed around the pin hole reacts with the coolant and the curing reaction takes place. Contrary to the case of covering with a film-like material, the pin hole is covered with a cured composition to keep the coolant from further leaking and, as a consequence, the normal operation of the cooling module can be continued without interruption. Further, in this case, a detection sensor disposed inside the integrated circuit chips cooling module detects the by-product formed in the curing reaction of the high-molecular weight compound and an alarm is transmitted by the leakage detection indicator. The alarm allows the operator of the cooling module to confirm the location of leakage on the cooling module and, if necessary, to replace the module.

According to the integrated circuit chips cooling module of this invention, when the coolant used in the coolant flow system is water and the high-molecular weight compound curable by reacting with water is a polymer having several alkoxyl end groups which is obtained by the reaction under anhydrous conditions between a reactive polysiloxane having a hydroxyl group at both ends and a crosslinking agent methyltrimethoxysilane, the polymer becomes cured by the condensation reaction of the alcohol elimination type as shown below, yielding an organic silicone rubber which tightly closes the spot where leakage occurs, such as, for example, a pin hole in a bellows-like pipe. The by-product of said curing reaction is methanol.

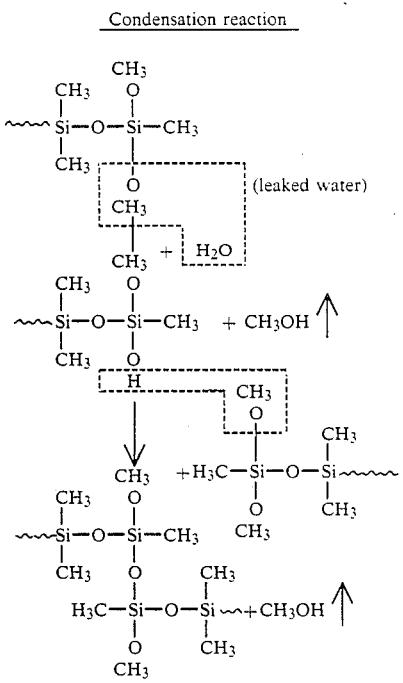

The methanol formed by the above reaction is detected by means of an alcohol detection sensor provided in the integrated circuit chips cooling module and a leak detection indicator transmits an alarm and indicates the location of leak position.

The invention is illustrated below with reference to accompanying drawings.

Figure 1:
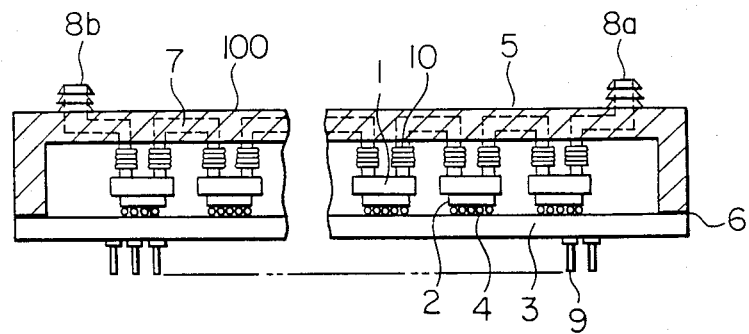
FIG. 1 is a rough drawing illustrating the general structure of the integrated circuit chips cooling module of this invention.

FIG. 1 is a rough drawing illustrating the general structure of the integrated circuit chips cooling module of this invention. The integrated circuit chips cooling module 100 is made by enclosing a large number of integrated circuit chips 2 mounted on a wiring substrate 3 with solder terminals 4 within a space encompassed with said wiring substrate 3 and a sealing hut 5 and affords a cooling means. The sealing is done by joining with solder 6 the edges of said sealing hut 5 to said wiring substrate 3. On the wiring substrate 3, a large number of integrated circuit chips 2 are electrically interconnected by way of solder terminals 4. On the backside of wiring substrate 3, there are provided a large number of in- and out-put pins 9 to connect the wiring circuit to the external circuit cards or circuit boards. The heat generated by the integrated circuit chips 2 is transmitted to cooling members 1 mounted on each integrated circuit chip and is removed by a coolant flowing through the cooling members 1. The coolant is fed through a coolant inlet nozzle 8a provided on the sealing hut 5 to a coolant channel 7, then flows via a bellows-like pipe 10 through each cooling member 1 and is discharged from a coolant outlet nozzle 8b to the outside of integrated circuit chips cooling module 100.

Figure 2:
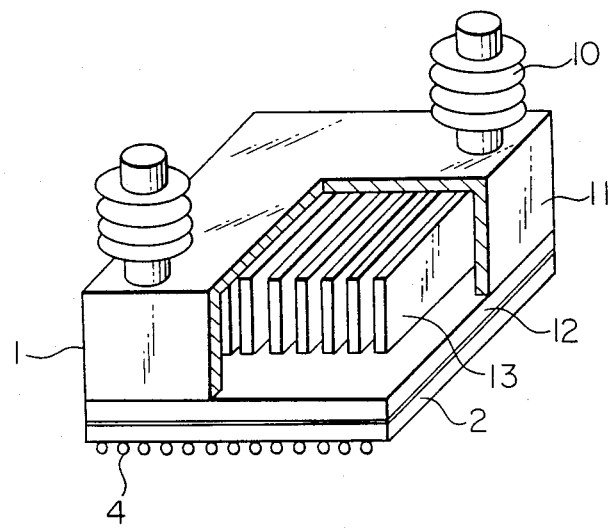
FIG. 2 is a perspective view illustrating an example of the internal structure of a cooling member in the cooling module of FIG. 1.

FIG. 2 is a perspective view illustrating an example of the internal structure of a cooling member 1 in the cooling module of FIG. 1. The cooling member 1 is constructed from an integrally molded bottom plate 12 and cooling fins 13, peripheral portions of the bottom plate 12, and a cap 11 soldered to the bottom plate at edges. Bellows-like pipes 10 are fixed to the top surface of cooling member 1, and serve to connect to coolant channels 7 provided in the sealing hut 5, as shown in FIG. 2. Owing to the spring action of bellows-like pipes 10, the cooling member 1 is pressed against or fixed to the top surface of integrated circuit chips 2. The heat generated in the integrated circuit chips 2 is transmitted, through the contact surface against or to which the cooling member 1 is pressed or fixed, successively to bottom plate 12, cooling fins 13, and the coolant.

The integrated circuit chips cooling module described above is disclosed in U.S. Pat. No. 4,644,385. This invention relates to the improvement of such cooling modules and, more particularly, to the coolant leakage prevention in the coolant flow system.

Figure 3:
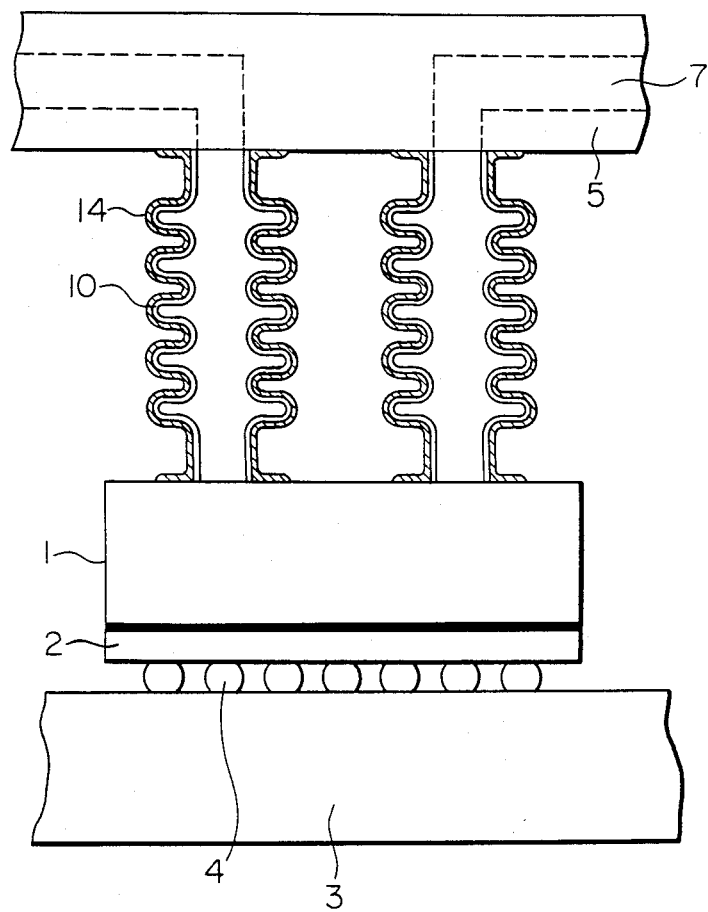
FIG. 3 is an enlarged sectional view illustrating a principal part (coolant flow system employinkg a bellows-like pipe) of the integrated circuit chips cooling module in one embodiment of this invention.

FIG. 3 is an enlarged sectional view illustrating a principal part of the integrated circuit chips cooling module in an embodiment of this invention and shows a coolant flow system employing bellows-like pipes. In this coolant flow system, a cooling member 1 with cooling fins formed therein and cooling channels 7 provided in the wall of a sealing hut 5 are interconnected by employing bellows-like pipes 10 to feed a coolant to the cooling member 1. The cooling member 1 is joined by pressure welding or anchoring to each of a plurality of integrated circuit chips which are signal-connected via solder terminals 4 to a wiring substrate 3 (multilayer wiring substrate). The heat generated in each of the integrated circuit chips 2 is transmitted through the pressure welded or anchored interface from cooling fins to the coolant, then through the coolant channels 7 to the outside of the cooling module. In this embodiment, an organic or inorganic high-molecular weight compound 14 (shown by hatching), which undergoes curing reaction upon contact with the leaked coolant, is coated on the surface of bellows-like pipes 10 where the possibility of coolant leakage is highest throughout the coolant flow system. If a pin hole appears in the bellows-like pipe 10, the coolant leakage is automatically stopped by the curing of high-moleculear weight compound 14 and it becomes unnecessary to interrupt the operation of the cooling module for repair.

When water is used as the coolant, it is desirable to use as high-molecular weight compound a polymer formed by the reaction under anhydrous conditions between a reactive polysiloxane and a polyfunctional silane compound. Upon reaction with leak water, such a polymer becomes cured to yield a rubber-like elastomer which does not impair the flexibility of bellows-like pipe 10. Since this polymer exhibits excellent adherence to various plastic and metals, the material of the bellows-like pipe is not limited to any special one. Depending upon the type of poly-functional silane compound (a crosslinking agent), used in its preparation, such a polymer, upon reaction with water, gives an alcohol, oxime, acetic acid, amide, or acetone as by-product. In view of the possible corrosion of integrated circuit chips 2 in the cooling module, it is preferable to use a polymer which undergoes condensation reaction of the alcohol elimination type, thereby yielding an alcohol as by-product. A typical example of such high-molecular weights compounds is a polymer having several alkoxyl end groups which is formed by the reaction under anhydrous conditions between a reactive polysiloxane having a hydroxyl group at both ends and a crosslinking agent methyltrimethoxysilane.

Figure 4:
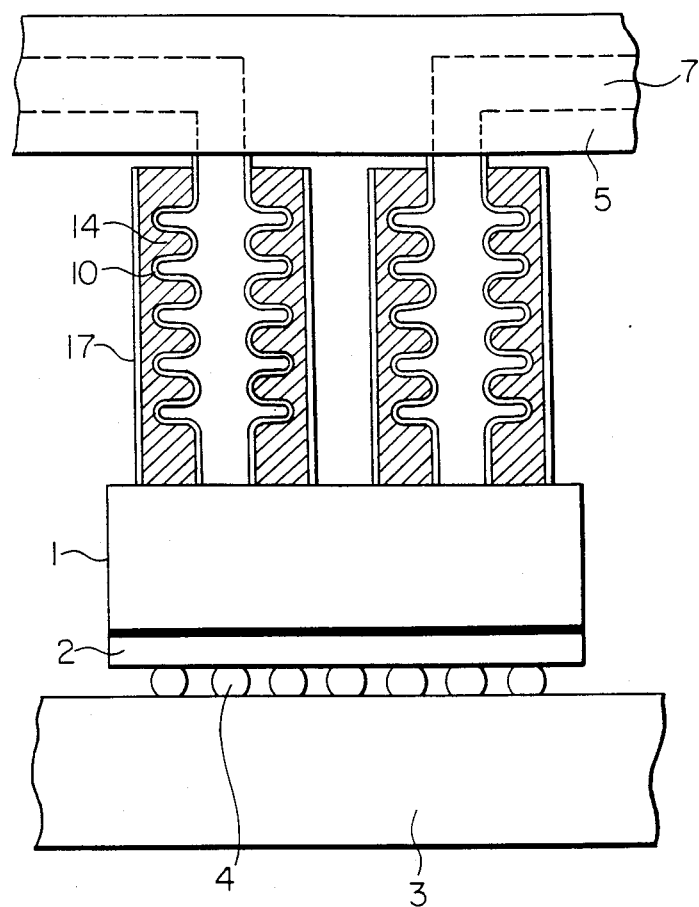
FIG. 4 is an enlarged sectional view illustrating the principal part of the integrated circuit chips cooling module in another embodiment of the invention.

FIG. 4 is an enlarged sectional view illustrating a principal part of the integrated circuit chips cooling module in another embodiment of this invention. In this embodiment, instead of coating a high-molecular weight compound 14 on the surface of bellows-like pipe 10, the latter is constructed to have a double-wall, the gap between the outer wall 17 and inner wall being filled with a high-molecular weight compound 14. Such a structure is effective in case the high-molecular weight compound 14 has a high fluidity so that it is difficult to retain a uniform thickness of the layer of high-molecular compound if applied by coating. Moreover, the outer wall 17 serves as an additional barrier against the leak coolant and, as a consequence, it has an advantage over the structure shown in FIG. 3 in confronting an emergency of large leakage.

Figure 5:
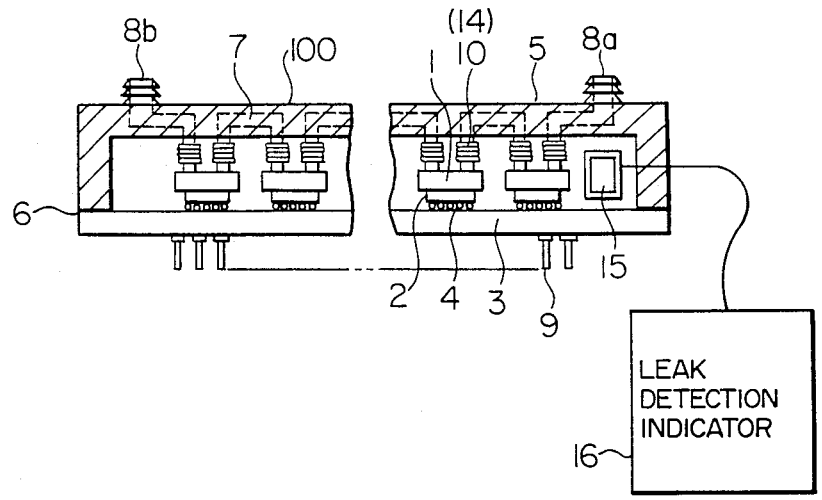
FIG. 5 is a schematic drawing illustrating the integrated circuit chips cooling module in still another embodiment of this invention.

FIG. 5 is a schematic drawing illustrating an integrated circuit chips cooling module provided with a leak detection means in still another embodiment of this invention. In a manner similar to that in FIG. 3 or 4, a coolant flow system is constructed using bellows-like pipes coated with a high-molecular weight compound (not shown in FIG. 5 to avoid complication) curable upon contact with a coolant. In this embodiment, the integrated circuit chips cooling module 100 contains a built-in sensor 15 for detecting the by-product formed in the curing reaction of the high-molecular weight compound 14. The output of the sensor 15 is connected to a leak detection indicator 16 disposed outside the cooling module 100. By use of such an arrangement, the operator can be informed of the occurrence of coolant leakage and the completion of automated repair of the leak.

For instance, when water is used as the coolant and a polymer curable with elimination of an alcohol as the high-molecular weight compound 14, it is possible to use an alcohol detection sensor employing an oxide semiconductor as the detection sensor 15. The detection sensor 15 employing an oxide semiconductor shows a change in resistance by adsorption of alcohol molecules to its surface. The change in resistance can be detected by means of a bridge circuit.

In FIG. 5, the output signal from the detection sensor 15 is fetched by the line passing through the wall of a sealing hut 5. It is also possible to fetch the signal via in- and out-put pins 9. It is further possible to transmit only the leak detection signal to the leak detection indicator 16 by integrating the detection sensor 15 and the bridge circuit (not shown).

According to the present embodiment, it is possible to detect the coolant leakage as well as to repair automatically the coolant leak spot.

As described in the foregoing, according to this invention, it becomes possible to detect the coolant leakage inside an integrated circuit chips cooling module and to automatically repair the spot of coolant leakage. As a result, the interruption of operation of the cooling module for the purpose of maintenance of replacement is unnecessary and, hence, the cooling module is improved in reliability. It is a general practice to provide a backup unit in the case wherein the continuous operation of cooling modules cannot be interrupted for the reason of safety or other reasons. According to this invention, such a back-up unit becomes unnecessary.

What is claimed is:

1. An integrated circuit chips cooling module comprising integrated circuit chips mounted on a wiring substrate;

cooling members having an internal space through which a coolant flows, said cooling members being thermally coupled with said integrated circuit chips;

a coolant flow system which allows a coolant to flow into and out of said internal space of the cooling members; and portions of a surface of said coolant flow system where the leakage of the coolant may possibly take place being contacted by an organic or inorganic high-molecular weight compound curable by reacting with the coolant to keep the latter from leakage.

2. An integrated circuit chips cooling module according to claim 1, wherein said portions are coated with a coating layer comprising the high-molecular weight compound which is applied to an outer surface of the coolant flow system.

3. An integrated circuit chips cooling module according to claim 1, wherein the surface of a portion of the coolant flow system has a double-wall structure filled with the high-molecular weight compound.

4. A integrated circuit chips cooling module according to claim 2 or 3, wherein the coolant is water and the high-molecular compound weight is a polymer formed by the reaction under anhydrous conditions between a reactive polysiloxane and a polyfunctional silane compound having a hydrolyzable group.

5. An integrated circuit chips cooling module according to claim 1, 2 or 3, wherein the coolant is water and the high-molecular weight compound is a polymer which is formed by reacting under anhydrous conditions a reactive polysiloxane having a hydroxyl group at both ends with a polyfunctional silane compound and which, upon reacting with the water, undergoes a condensation reaction of the alcohol elimination type and becomes hardened, thereby yielding an organic silicone rubber and a by-product alcohol.

6. An integrated circuit chips cooling module according to claim 1, 2 or 3, wherein there is provided a means for detecting the coolant leakage by detecting the by-product formed in the curing reaction of the high-molecular weight compound with the leaked coolant.

7. An integrated circuit chips cooling module according to claim 6, wherein the coolant leakage detection means comprises (a) a detection sensor for detecting the by-product formed in the curing reaction of the high-molecular weight compound curable upon reaction with the coolant and (b) a circuit which, in response to the signal from said detection sensor, transmits at least either a leak detection alarm or a leak detection display.

8. An integrated circuit chips cooling module according to claim 7, wherein the detection sensor is a sensor for detecting an alcohol.

9. An integrated circuit chips cooling module comprising a plurality of integrated circuit chips mounted on a wiring substrate; a plurality of cooling members which allow a coolant to flow inside them and which are thermally coupled with each of said integrated circuit chips; and a coolant flow system which allows the coolant to flow through a plurality of said cooling members; at least portions of the surface of said coolant flow system where being contacted by leakage of the coolant may possibly take place, the an organic or inorganic high-molecular weight compound which is curable by reacting with the coolant to keep the latter from leakage.

10. An integrated circuit chips cooling module according to claim 9, wherein said portions are coated with a layer comprising the high-molecular weight compound which is applied to an outer surface of the coolant flow system.

11. An integrated circuit chips cooling module according to claim 9, wherein the coolant flow system has a double-wall structure filled with the high-molecular weight compound.

12. An integrated circuit chips cooling module according to claim 9, wherein said compound contacts the surface of a bellows-type pipe member of the coolant flow system which allows the coolant to flow into and from each of the cooling members.

13. An integrated circuit chips cooling module according to any of claims 9 to 12, wherein the coolant is water and the high-molecular weight compound is a polymer formed by the reaction under anhydrous conditions between a reactive polysiloxane and a polyfunctional silane compound having a hydrolyzable group.

14. An integrated circuit chips cooling module according to any of claims 9 to 12, wherein the coolant is water and the high-molecular weight compound is a polymer which is formed by the reaction under anhydrous conditions between a reactive polysiloxane having a hydroxyl group at both ends and a polyfunctional silane compound having an alkoxyl group and which, upon reacting with the water, undergoes a condensation reaction of the alcohol elimination type and becomes cured, thereby yielding an organic silocone rubber and a by-product alcohol.

15. An integrated circuit chips cooling module according to any of claims 9 to 12, wherein there is provided a means for detecting the coolant leakage by detecting the by-product formed in the curing reaction of the high-molecular weight compound with the leaked coolant.

16. An integrated circuit chips cooling module according to claim 15, where the coolant leakage detection means comprises (a) a detection sensor for detecting the by-product formed in the curing reaction of the high-molecular weight compound which is curable upon reaction with the coolant and (b) a circuit which, in response to the signal from said detection sensor, transmits at least either a leak detection alarm or a leak detection display.

17. An integrated circuit chips cooling module according to claim 16, wherein the detection sensor is a sensor for detecting an alcohol.

18. An integrated circuit chips cooling module comprising a plurality of integrated circuit chips mounted on a wiring substrate;

a plurality of cooling members which allow a coolant to flow inside them and which are thermally coupled with each of said integrated circuit chips;

a hut member which, jointly with said wiring substrate, seals off said integrated circuit chips and cooling members;

a coolant flow system which allows a coolant to flow into and from each of said cooling members as well as to circulate through the cooling members and which has bellows-like members to connect coolant channels to each cooling member enclosed in said hut member; and a coated portion on the surface of each of said bellows-like members, said coated portion comprising an organic or inorganic high-molecular weight compound which is curable upon reaction with the coolatn to keep the latter from leakage.

19. An integrated circuit chips cooling module according to claim 18, wherein the coolant is water and the high-molecular weight compound is a polymer which is formed by the reaction under anhydrous conditions between a reactive polysiloxane having a hydroxyl group at both ends and a polyfunctional silane compound having an alkoxyl group and which, upon reacting with the water, undergoes a condensation reaction of the alcohol elimination type and becomes cured, thereby yielding an organic silicone rubber and a by-product alcohol.

20. An integrated circuit chips cooling module according to claim 18, wherein there is provided a means for detecting the coolant leakage by detecting the by-product formed in the curing reaction of the high-molecular weight compound with the leaked coolant.

* * * * *